US011380616B2

(12) United States Patent
O'Sullivan et al.

(10) Patent No.: US 11,380,616 B2
(45) Date of Patent: Jul. 5, 2022

(54) FAN OUT PACKAGE-ON-PACKAGE WITH ADHESIVE DIE ATTACH

(71) Applicant: Intel IP Corporation, Santa Clara, CA (US)

(72) Inventors: David O'Sullivan, Munich (DE); Bernd Waidhas, Pettendorf (DE); Thomas Huber, Hallbergmoos (DE)

(73) Assignee: Intel IP Corporation, Santa Clara, CA (US)

( * ) Notice: Subject to any disclaimer, the term of this patent is extended or adjusted under 35 U.S.C. 154(b) by 902 days.

(21) Appl. No.: 15/981,830

(22) Filed: May 16, 2018

(65) Prior Publication Data

US 2019/0355659 A1 Nov. 21, 2019

(51) Int. Cl.
*H01L 23/522* (2006.01)
*H01L 23/538* (2006.01)
(Continued)

(52) U.S. Cl.
CPC .......... *H01L 23/5226* (2013.01); *H01L 23/28* (2013.01); *H01L 23/5384* (2013.01);
(Continued)

(58) Field of Classification Search
CPC . H01L 23/5226; H01L 23/5384; H01L 23/28; H01L 24/94; H01L 25/50; H01L 25/0657; H01L 2224/2919; H01L 2224/131; H01L 2224/81399; H01L 24/13; H01L 24/97; H01L 24/81; H01L 24/16;
(Continued)

(56) References Cited

U.S. PATENT DOCUMENTS 8,518,746 B2 * 8/2013 Pagaila .................. H01L 24/96
438/618
9,318,452 B2 * 4/2016 Chen ....................... H01L 25/10
(Continued)

FOREIGN PATENT DOCUMENTS

KR 20170048439 5/2017

OTHER PUBLICATIONS

International Search Report and Written Opinion for PCT Application No. PCT/US19/27743, dated Aug. 1, 2019.
(Continued)

*Primary Examiner* — Victor A Mandala
(74) *Attorney, Agent, or Firm* — Essential Patents Group, LLP.

(57) ABSTRACT

Fan Out Package-On-Package (PoP) assemblies in which a second chip is adhered to a non-active side of a first chip. An active side of the first chip embedded in a first package material may be electrically coupled through one or more redistribution layers that fan out to package interconnects on a first side of the POP. A second chip may be adhered, with a second package material, to the non-active side of the first chip. An active side of the second chip may be electrically coupled to the package interconnects through a via structure extending through the first package material. Second interconnects between the second chip, or a package thereof, may contact the via structure. Use of the second package material as an adhesive may improve positional stability of the second chip to facilitate wafer-level assembly techniques.

20 Claims, 9 Drawing Sheets

(51) Int. Cl.
*H01L 23/28* (2006.01)
*H01L 23/00* (2006.01)
*H01L 25/00* (2006.01)
*H01L 25/065* (2006.01)

(52) U.S. Cl.
CPC .......... *H01L 24/94* (2013.01); *H01L 25/0657* (2013.01); *H01L 25/50* (2013.01)

(58) Field of Classification Search
CPC ........... H01L 2224/81815; H01L 24/14; H01L 24/96; H01L 2225/1023; H01L 2225/1058; H01L 2225/1041; H01L 25/03; H01L 21/561; H01L 23/315; H01L 23/16; H01L 23/3135; H01L 23/3128; H01L 2924/181; H01L 2224/16225; H01L 24/17; H01L 2224/18; H01L 23/49816; H01L 23/49833; H01L 23/5389
See application file for complete search history.

(56) References Cited

U.S. PATENT DOCUMENTS

| | | | | |
|---|---|---|---|---|
| 9,461,018 B1* | 10/2016 | Tsai | | H01L 21/78 |
| 9,666,502 B2* | 5/2017 | Chen | | H01L 24/97 |
| 9,735,131 B2* | 8/2017 | Su | | H01L 23/5389 |
| 10,269,589 B2* | 4/2019 | Tsou | | H01L 23/5386 |
| 10,269,773 B1* | 4/2019 | Yu | | H01L 24/19 |
| 10,276,404 B2* | 4/2019 | Wu | | H01L 21/568 |
| 10,347,574 B2* | 7/2019 | Jeng | | H01L 24/03 |
| 10,515,901 B2* | 12/2019 | Lin | | H01L 23/5389 |
| 10,529,697 B2* | 1/2020 | Cheng | | H01L 25/0657 |
| 10,573,589 B2* | 2/2020 | Kim | | H01L 23/49838 |
| 11,031,328 B2* | 6/2021 | Cho | | H01L 23/49894 |
| 11,031,345 B2* | 6/2021 | Kim | | H01L 23/5384 |
| 11,049,802 B2* | 6/2021 | Wu | | H01L 23/145 |
| 2014/0048906 A1* | 2/2014 | Shim | | H01L 23/49816 257/532 |
| 2014/0185258 A1* | 7/2014 | Lee | | H01L 23/642 361/761 |
| 2014/0185264 A1* | 7/2014 | Chen | | H01L 23/3128 361/814 |
| 2015/0145142 A1* | 5/2015 | Lin | | H01L 23/481 257/774 |
| 2016/0013156 A1* | 1/2016 | Zhai | | H01L 25/50 438/109 |
| 2016/0093597 A1* | 3/2016 | Chang | | H01L 25/0652 257/737 |
| 2016/0148904 A1 | 5/2016 | Zhai et al. | | |
| 2016/0300817 A1* | 10/2016 | Do | | H01L 23/49811 |
| 2016/0307872 A1* | 10/2016 | Chen | | H01L 21/565 |
| 2016/0329307 A1* | 11/2016 | Tsai | | H01L 21/76802 |
| 2017/0033062 A1* | 2/2017 | Liu | | H01L 23/528 |
| 2017/0077073 A1 | 3/2017 | Lin et al. | | |
| 2017/0133351 A1* | 5/2017 | Su | | H01L 21/6835 |
| 2017/0140202 A1* | 5/2017 | Huang | | H01L 23/49827 |
| 2017/0221859 A1* | 8/2017 | Chen | | H01L 25/105 |
| 2017/0228529 A1* | 8/2017 | Huang | | H01L 21/4857 |
| 2017/0254968 A1 | 9/2017 | Ding et al. | | |
| 2017/0301650 A1* | 10/2017 | Yu | | H01L 21/0217 |
| 2017/0317038 A1* | 11/2017 | Tsai | | H01L 23/5389 |
| 2017/0317054 A1* | 11/2017 | Tsao | | H01L 24/97 |
| 2017/0317057 A1* | 11/2017 | Chen | | H01L 21/78 |
| 2017/0317058 A1* | 11/2017 | Chen | | H01L 24/06 |
| 2017/0338204 A1* | 11/2017 | Lee | | H01L 24/20 |
| 2017/0352611 A1* | 12/2017 | Graf | | H01L 23/49861 |
| 2018/0026010 A1* | 1/2018 | Huang | | H01L 23/5386 257/659 |
| 2018/0082988 A1* | 3/2018 | Cheng | | H01L 23/49811 |
| 2018/0090465 A1* | 3/2018 | Chen | | H01L 25/50 |
| 2018/0096939 A1* | 4/2018 | Chiu | | H01L 23/5386 |
| 2018/0122764 A1* | 5/2018 | Chen | | H01L 24/14 |
| 2018/0122780 A1* | 5/2018 | Chen | | H01L 24/20 |
| 2018/0131094 A1* | 5/2018 | Ho | | H01Q 9/045 |
| 2019/0006200 A1* | 1/2019 | Lin | | H01L 23/3128 |
| 2019/0006315 A1* | 1/2019 | Hsu | | H01L 25/105 |
| 2019/0103362 A1* | 4/2019 | Lin | | H01L 25/105 |
| 2019/0103379 A1* | 4/2019 | Yu | | H01L 23/3128 |
| 2019/0131242 A1* | 5/2019 | Lee | | H01L 23/3128 |
| 2019/0131283 A1* | 5/2019 | Chen | | H01L 21/563 |
| 2020/0212012 A1* | 7/2020 | Meyers | | H01L 25/50 |
| 2020/0243448 A1* | 7/2020 | Qian | | H01L 23/5389 |

OTHER PUBLICATIONS

International Preliminary Report on Patentability for PCT Application No. PCT/US2019/027743, dated Nov. 26, 2020.

* cited by examiner

FAN OUT PACKAGE-ON-PACKAGE WITH ADHESIVE DIE ATTACH

BACKGROUND

In electronics manufacturing, integrated circuit (IC) packaging is a stage of semiconductor device fabrication, in which an IC that has been fabricated on a die or chip comprising a semiconducting material is encapsulated in a supporting case or "package" that can protect the IC from physical damage and support electrical contacts that connect the device to a host circuit board. In the IC industry, the process of fabricating a package is often referred to as packaging, or assembly.

Package-on-package (POP) technology is a 3D packaging architecture that integrates multiple components (e.g., IC chips) vertically where two or more packages are installed with one atop another (i.e., stacked). IC chips may be assembled in various manners within a POP architecture. For example, a first IC chip may have a ball grid array (BGA) package while a second IC chip stacked on the first may be connected to the first IC chip through additional BGA connections. As another example, a fist IC chip may have a flip-chip BGA package (e.g., FCBGA) while a second IC chip stacked on a back side of the first chip is connected to the first IC chip through wire bonds (e.g., a hybrid stack FBGA).

The current trend in POP and flip-chip wirebond packages brings new challenges in high volume manufacturability and physical dimensions of the packages. Devices are under greater pressure to achieve new milestones in form factor even while the complexity of their design increases. In POP package architectures, z-height (thickness) is a very important characteristic. For example in some device applications, package z-heights of 0.3-0.4 mm, or less, are highly desirable.

For high volume manufacturability, wafer-level packaging (WLP) techniques where many chips are packaged in parallel while on a carrier wafer or panel are advantageous. For example, in a fan-out package, a die is embedded into a molding compound during a reconstitution process. I/Os of the die may then be redistributed with conductive routes between the die and solder features that may extend an arbitrary distance from the die edge as supported by the molding compound. However, many WLP techniques are challenging to extend to POP architectures. One challenge, for example, is adding sufficient stability to the top die attach process.

BRIEF DESCRIPTION OF THE DRAWINGS

The subject matter described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1A:
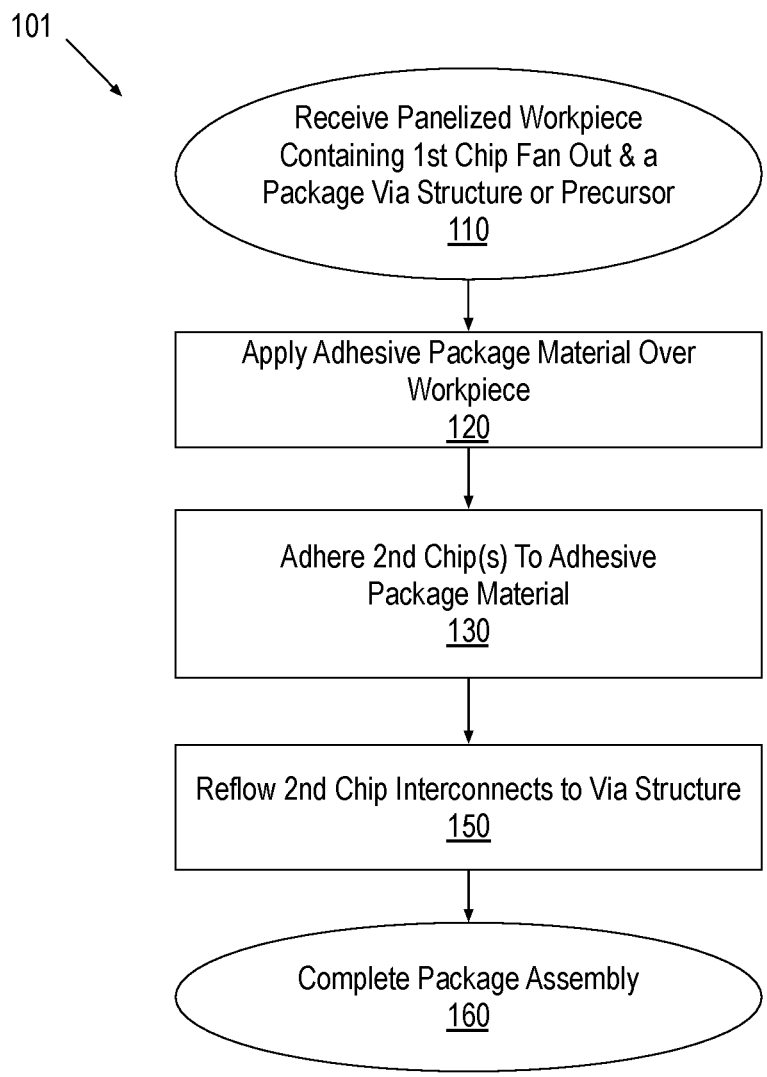
FIG. 1A is a flow diagram illustrating methods of fabricating a fan out PoP with adhesive die attach, in accordance with some embodiments.

One or more embodiments are described with reference to the enclosed figures. While specific configurations and arrangements are depicted and discussed in detail, it should be understood that this is done for illustrative purposes only. Persons skilled in the relevant art will recognize that other configurations and arrangements are possible without departing from the spirit and scope of the description. It will be apparent to those skilled in the relevant art that techniques and/or arrangements described herein may be employed in a variety of other systems and applications other than what is described in detail herein.

Reference is made in the following detailed description to the accompanying drawings, which form a part hereof and illustrate exemplary embodiments. Further, it is to be understood that other embodiments may be utilized and structural and/or logical changes may be made without departing from the scope of claimed subject matter. It should also be noted that directions and references, for example, up, down, top, bottom, and so on, may be used merely to facilitate the description of features in the drawings. Therefore, the following detailed description is not to be taken in a limiting sense and the scope of claimed subject matter is defined solely by the appended claims and their equivalents.

In the following description, numerous details are set forth. However, it will be apparent to one skilled in the art, that embodiments may be practiced without these specific details. In some instances, well-known methods and devices are shown in block diagram form, rather than in detail, to avoid obscuring the embodiments. Reference throughout this specification to "an embodiment" or "one embodiment" or "some embodiments" means that a particular feature, structure, function, or characteristic described in connection with the embodiment is included in at least one embodiment. Thus, the appearances of the phrase "in an embodiment" or "in one embodiment" or "some embodiments" in various places throughout this specification are not necessarily referring to the same embodiment. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example in the context of materials, one material or material disposed over or under another may be directly in contact or may have one or more intervening materials. Moreover, one material disposed between two materials or materials may be directly in contact with the two layers or may have one or more intervening layers. In contrast, a first material or material "on" a second material or material is in direct contact with that second material/material. Similar distinctions are to be made in the context of component assemblies.

As used throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C.

Described herein are exemplary fan out Package-On-Package (PoP) assemblies in which a chip is adhered to another chip. In some examples an active side of a first chip embedded in a first package material may be electrically coupled through one or more redistribution layers that fan out to package interconnects on a first side of the PoP assembly. A second chip may be adhered, for example with a second package material, to the non-active side of the first chip. The second package material may be any suitable for maintaining a position of the second chip relative to the first chip and/or relative to a via structure that extends through the first package material and electrically couples an active side of the second chip to the redistribution layers and/or package interconnects on the first side of the PoP assembly. The redistribution layers and/or package interconnects on the first side of the PoP assembly may therefore electrically couple the first chip to the second chip with the via structure occupying a portion of the POP assembly area adjacent to the first chip that supports the fan out. Second interconnects between the second chip (or a package of the second chip that further includes other redistribution layers) may contact the via structure. These second interconnects may be reflowed while adhesion provided by the second package material maintains proper positioning of the second chip.

Described further herein are exemplary methods for fabricating a fan out PoP assembly in which an adhesive is applied between a first component (e.g., IC chip) and a second component (e.g., IC chip). Application of the adhesive may be subsequent to subjecting the first chip to a wafer-level fan out process, for example. In some embodiments, the adhesive is applied selectively to a non-active side of the first chip so as to localize the adhesive material in a manner that leaves an adjacent (off-chip) via structure available to receive interconnect structures that are present on the second component. A second component may be pressed into the adhesive, for example with a pick-and-place machine, so that interconnect structures coupled to the second component are positioned over the via structure. As further described below, additional operations may then be performed once the second component is adhered in a proper position. For example, another package material may be underfilled between interconnect structures of the second component. In another example, one or more additional package materials may be applied over the second component. During the assembly process, a final reflow may be performed to make intimate contact between the second component and the via structure. As further described below, adhesive material employed within a PoP assembly architecture in accordance with embodiments herein may facilitate wafer-level processing of PoP assemblies that can achieve reduced z-heights (e.g., PoP thicknesses).

FIG. 1A is a flow diagram illustrated methods 101 for fabricating a fan out PoP with adhesive die attach, in accordance with some embodiments. Methods 101 begin at block 110 with the receipt of a workpiece containing a first IC chip. In an exemplary embodiment, the workpiece is panelized and includes a plurality of the first IC chips arrayed over the panel for parallel package assembly. The workpiece may have been fabricated upstream of block 100 according any IC chip reconstitution process, for example. The workpiece received at block 110 further includes a first package material. The first IC chip may be at least partially embedded within this first package material. Along with the first IC chip, a via structure, or a precursor of a "through-package" or "through-mold" via, occupies an area within the first package material that is adjacent to an edge of the first IC chip. The via structure or precursor is therefore off the first chip within a portion of the first package material that may further support fan out of input/output (I/O) routing of the first IC chip within one or more conductive redistribution layers present on a first side of the first package material. One or more of the I/Os of the first IC chip may be electrically coupled to one or more vias of the via structure, and/or may extend into the portion of the first package material that is to receive a through-mold via, for example.

Methods 101 continue at block 120 where a second package material is applied to the workpiece. The second package material is to be operable as an adhesive, at least temporarily. The second package material may be of any composition, and applied in any manner, such that the second package material is operable to adhere a second IC chip (e.g., that is within a second package) to the first IC chip and/or to the first package material. Advantageously, the second package material is selectively applied and/or patterned into an adhesive feature of some predetermined dimension(s) at block 120 so as to facilitate electrical connections between one or more I/Os of the second IC chip (or package thereof) and the via structure. For example, the second package material may be confined to regions over the first IC chip and/or over the first package material that are adjacent to the via structure/precursor such that electrical connections between the second IC chip I/Os and the via structure can be made without interference from the second package material. As described further below, block 120 may include one or more of screen printing the second package material, masked-based patterning the second package material, selectively dispensing the second package material, or pick-and-placing pre-fabricated pads of the second package material. Block 120 may be performed for each package assembly within a panelized the workpiece, for example.

In some embodiments, for example where the fan out region of the first package material lacks a prefabricated via structure, one or more via structures may be formed at block 120 (before or after applying the second package material). For example, one or more through mold vias may be milled (e.g., with any suitable laser ablation process or etching process) into a portion of the first package material adjacent to the first IC chip and/or adjacent to the second package material feature. Such through mold vias may expose one or more conductive feature that is coupled to the first IC chip through the redistribution layer(s) within the fan out region adjacent to an edge of the first IC chip. In other embodiments where the fan out region of the first package material includes a prefabricated via structure, block 120 may include one or more operations to prepare (e.g., expose) conductive surfaces of the via structure in preparation for subsequent blocks in methods 101. Such operations may again be performed before or after application of the second package material.

Methods 101 continue at block 130 where a second IC chip, or a package containing the second IC chip (i.e., a second component), is mounted, affixed, or adhered to the second package material. Any technique known to be suitable for positioning an IC chip onto a package substrate, board, or PoP assembly, etc. may be employed at block 130. As one example, a pick-and-place machine may pick-and-place the second IC chip onto the second package material. The dimensions of each "pad" or feature of the second package material should therefore be sufficient to accommodate the positional accuracy of the pick-and-place machine. In some exemplary embodiments where the second IC chip is coupled to external electrical interconnects, such as solder or solder paste features (e.g., ball grid array, microballs, bumps, solder posts or pillers), block 320 may entail aligning the second IC chip to a reference so that the electrical interconnects coupled to the second IC chip may make contact with conductive features of the via structure. Block 320 may again be performed for each package assembly within a panelized workpiece, for example. Such parallel PoP assembly may leverage the adhesive provided by the second package material so that there is sufficient stability in the co-location of the second IC chip and a corresponding via structure.

Methods 101 continue at block 150 where a thermal process is performed to heat the package assemblies to an elevated temperature sufficient to reflow one or more electrical interconnects. For example, where a component including the second chip includes external electrical interconnects (e.g., solder and/or solder paste features), these electrical interconnects are heated at block 150 to any temperature suitable for reflowing sufficiently to electrically couple I/O ports of the second IC chip to conductive features of at least the via structure.

Methods 101 complete at operation 160 where the package assembly is completed through any further packaging operations known to be suitable for a PoP assembly. For example, block 160 may include the application of additional package materials, and/or laser marking of each PoP assembly within a panel, and/or singulating the panel of PoP assemblies, and/or electrically testing the PoP assemblies, and/or packing the PoP assemblies for shipment to an end user (e.g., a platform or board-level assembly house). Notably, one of more of the blocks in methods 101 may be iterated to increase the number of IC chips integrated within a PoP assembly beyond two chips. For example, blocks 120 and 130 may be repeated any number of times with additional chips adhered to additional adhesive package materials as limited only by the footprint of the additional component(s), and the dimension of the via structure and/or through mold vias that are to electrically couple to any additional adhesively attached component(s).

Figure 1B:
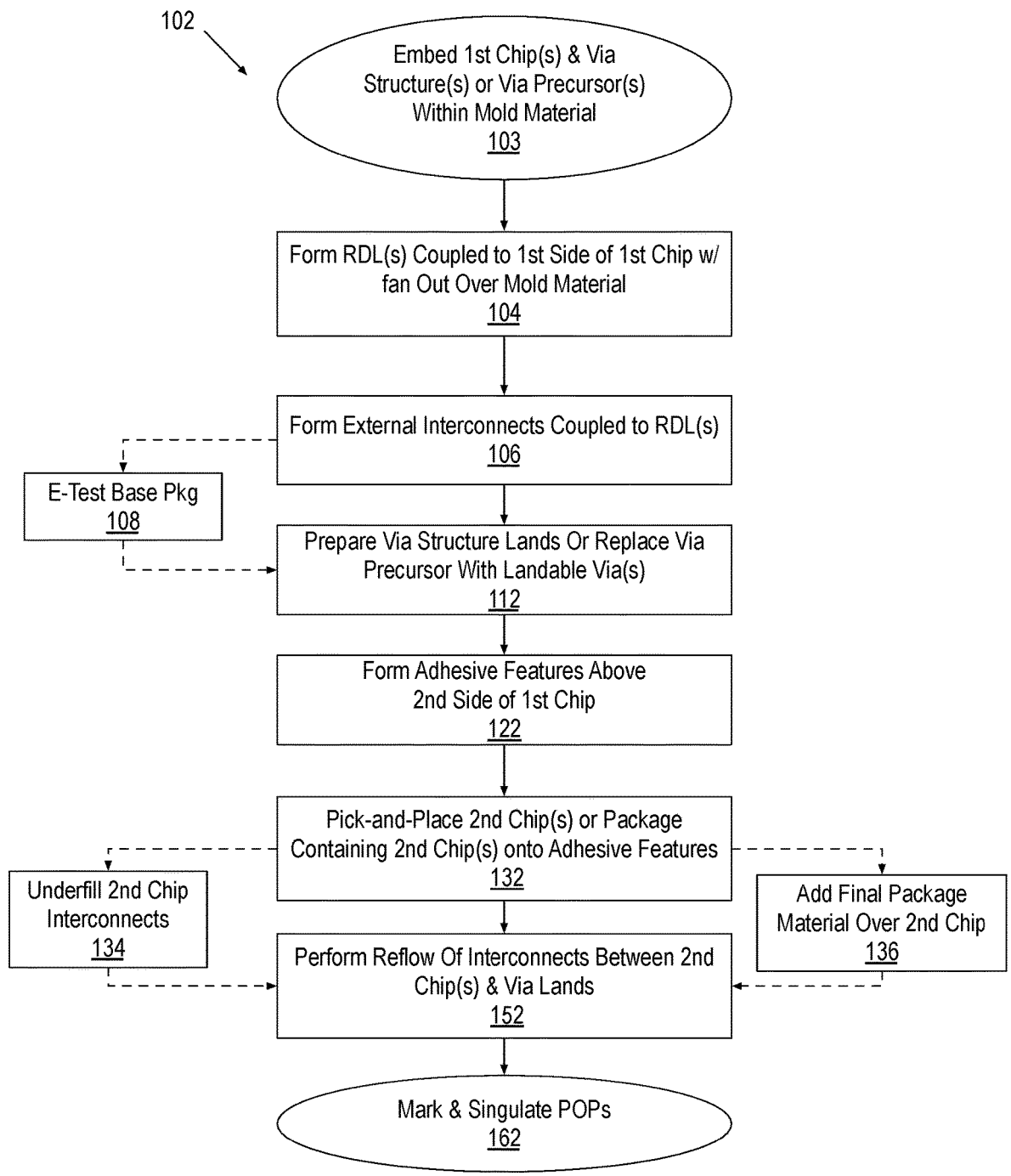
FIG. 1B is a flow diagram illustrating methods of fabricating a fan out PoP with adhesive die attach, in accordance with some embodiments.

With methods 101 outlining a number of exemplary embodiments of fabricating a fan out PoP with adhesive die attach, methods 102 of fabricating a fan out PoP with adhesive die attach in accordance with some specific embodiments are further described in the context of FIG. 1B. Methods 102 may be performed, for example, in the practice of methods 101. FIGS. 2A, 2B, 2C, 2D, 2E, 2F, and 2G illustrate cross-sectional views of a fan out PoP with adhesive die attach evolving as selected blocks in methods 102 are performed, in accordance with some exemplary embodiments.

Referring first to FIG. 1B, methods 102 begin at block 103 where a first IC chip is embedded within a first package matrix material, which in some exemplary embodiments is any material known to be suitable for IC chip package mold casting. The first package material may be any suitable dielectric material and may be introduced wet/uncured into a cast and then dried/cured. Alternatively, the first package material may be any suitable dielectric material that may be introduced as a semi-cured dry film, for example as a laminate that is deformed around the first IC chip during a packaging build up, and then fully cured. The first IC chip is advantageously at least partially embedded within the first package material. For example, in some embodiments, a sidewall of the first IC chip is at least partially covered by the first package material, for example by a molding process performed with an active side of the first IC chip facing down on a panel or carrier. The first package material may also be molded or otherwise applied concurrently around a pre-fabricated via structure positioned adjacent an edge of the first IC. The via structure may comprise any number of materials and may have been fabricated according to any suitable techniques, such as, but not limited to, microelectronic fabrication and/or micromachining techniques. At block 103, the via structure may also be placed on the carrier or panel and then embedded into the first package material concurrently with the first IC chip.

Figure 2A:
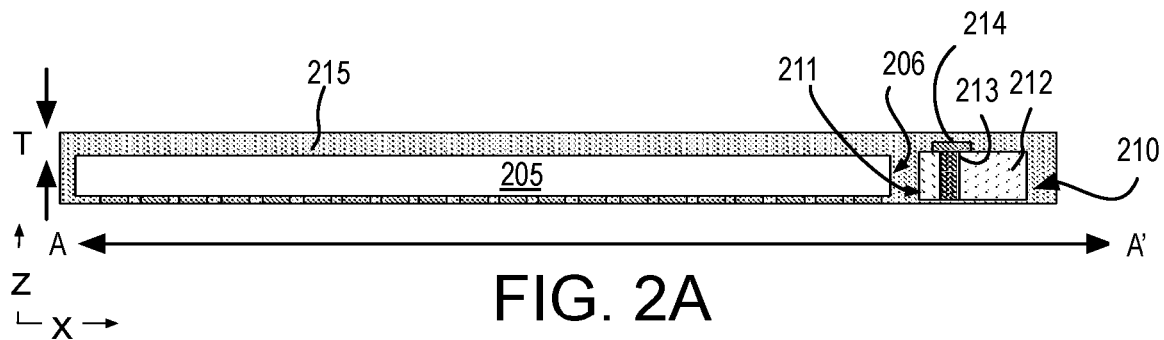
FIGS. 2A, 2B, 2C, 2D, 2E, 2F, and 2G illustrate cross-sectional views of a fan out PoP with adhesive die attach evolving as selected operations in a method of fabricating a fan out PoP are performed, in accordance with some embodiments.

FIG. 2A further illustrates a cross-sectional view of an exemplary component including an IC chip 205 partially embedded within package material 215. The cross-section view shown in FIG. 2A is along an A-A' line further illustrated in a plan view of a completed PoP assembly shown in FIG. 3A, and as further described below. The component shown in FIG. 2A may be fabricated during block 103 of methods 102, for example. In some embodiments, IC chip 205 includes microprocessor circuitry. In some such embodiments, the microprocessor circuitry is operable to execute a real-time operative system (RTOS). In some further embodiments, IC chip 205 executes one or more layers of a software stack that controls radio (wireless) functions. In one exemplary embodiment, IC chip 205 includes a digital baseband processor, or baseband radio processor (BBP) suitable for use within a mobile phone, or other wireless/mobile device.

As further shown in FIG. 2A, IC chip 205 has a sidewall 206 that is substantially embedded within package material 215. Package material 215 may be any suitable matrix or carrier material and may be dimensioned to have any size or shape. Many such materials exist, such as, but not limited to an epoxy resins (e.g., an acrylate of novolac such as epoxy phenol novolacs (EPN) or epoxy cresol novolacs (ECN)). In some embodiments, the package material 215 is a bisphenol-A epoxy resin, for example including epichlorohydrin. In some embodiments, package material 215 includes bisphenol-F epoxy resin (with epichlorohydrin). In some embodiments, package material 215 includes aliphatic epoxy resin, which may be monofunctional (e.g. dodecanol glycidyl ether), difunctional (butanediol diglycidyl ether), or have higher functionality (e.g. trimethylolpropane triglycidyl ether). In some embodiments, package material 215 includes glycidylamine epoxy resin, such as triglycidyl-p-aminophenol (functionality 3) and N,N,N',N'-tetraglycidyl-bis-(4-aminophenyl)-methane (functionality 4).

As further shown in FIG. 2A, a via structure 210 is also at least partially embedded within package material 215. Via structure 210 is to be operable as a through-carrier or through-package interconnect, or is to be operable as a placeholder for such an interconnect. As shown, via structure 210 has a sidewall 211 that is adjacent to IC chip sidewall 206. Via structure sidewall 211 is separated from IC chip sidewall 206 by an intervening portion of package material 215. Hence, via structure 210 is external to IC chip 205 and integrated with IC chip 205 at the package level. Via structure 210 may include one or more semiconductor (e.g., crystalline silicon) and/or dielectric (e.g., silicon dioxide) materials 212, and one or more conductive vias 213 extending through a z-height or z-thickness (in the z-axis of FIG. 2A) of via structure 210. Conductive vias 213 may comprise any suitable metal(s), such as, but not limited to, tin, aluminum, copper, silver, nickel, gold, tungsten, platinum, and alloys or compounds thereof. Notably, a via structure may be shared with an adjacent package and separated at package singulation, for example as described further below. Via structure 210 further includes one or more redistribution layer(s) and/or other conductive feature(s) 214 that are suitable for subsequent coupling to an interconnect of a second IC chip. Conductive features 214 may have a layout with one or more rows or columns of a fixed pitch (e.g., with an orthogonal format) or have a staggered adjacent (close-packed) arrangement. In some alternative embodiments, via structure 210 is merely a placeholder comprising one or more sacrificial material that will be removed during the fabrication of one or more through-mold vias. In still other embodiments, via structure 210 is completely absent and package material 215 occupies the entire region where via structure 210 is shown in FIG. 2A.

As further shown in FIG. 2A, package material 215 is over a back side, or inactive side, of IC chip 205. The thickness T (z-dimension) of package material 215 over the back side of IC chip 205 may vary, but since overall package assembly thickness for high value components is important, package material 215 may be thinned or fully removed from the non-active side of IC chip 205 following the embedding/reconstitution process. It may also be advantageous to thin package material 215 in a controlled many to achieve a sufficiently uniform thickness to facilitate subsequent formation of through-mold vias within a fan out region of package material 215. Package material 215 may be thinned with any suitably uniform process (e.g., chemical and/or mechanical polishing, grinding, or lapping). It may also be advantageous to leave via structure 210 fully embedded within package material 215, protecting via structure 210 from subsequent processing steps.

Figure 2B:
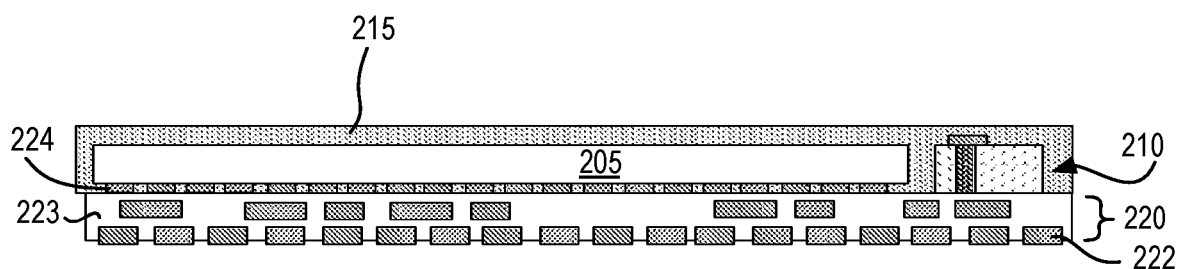

Returning to FIG. 1B, methods 102 continue at block 104 where one or more redistribution layers (RDLs) coupled to one or more I/O ports of the first IC chip are fabricated over an active side of the first IC chip and/or over a side of the first package material. In exemplary embodiments, the RDL features extend beyond a sidewall of the first IC chip within a fan out region of the first component that is supported by the first package material adjacent to the first IC chip. The pre-defined electrically conductive routings of the RDL may be formed over the active side of the wafer, for example, using any suitable subtractive and/or additive manufacturing techniques. In some embodiments, RDL manufacturing includes one or more of photolithography, thin film sputter deposition, thin film etching, thin film plating, etc. One or more dry film build up techniques may also be employed, such as, but not limited to the lamination of resinous films (e.g., GX-series films commercially available from Ajinomoto Fine-Techno Co., Inc.). The various subtractive and/or additive manufacturing processes may be sequentially performed until electrical traces and/or interconnects have been distributed over the chip and over the fan out area of the package material (i.e., carrier matrix). FIG. 2B illustrates an exemplary structure including the component illustrated in FIG. 2A with the addition of redistribution layers 220. As shown RDL 220 includes conductive routing 222 electrically isolated by one or more dielectric materials 223 that have been built up over an active side of IC chip 205. Conductive routing 222 may be coupled to one or more chip-level I/O features 224 of IC chip 205. As shown, RDL 220 extends over an area larger than IC chip 205, which may be referred to as a fan out structure. Conductive routing 222 may be further coupled to one or more conductive via 213 of via structure 210.

Returning to FIG. 1B, methods 102 continue at block 106 with the formation of external interconnects coupled to the RDL features that were formed at block 104. The external interconnects formed at block 106 are to make electrical contact to various ones of the previously constructed redistribution layers and therefore to various I/O ports of the packaged IC chip. The external interconnects formed at block 106 are further to subsequently attach the package component(s) to any suitable printed circuit board (PCB). With fan out of the signal paths in the RDL formed at block 104, the external interconnects may extend beyond an edge of the first IC chip and outside of the package to the external system. In the example further illustrated in FIG. 2C, solder features 230 have been formed or attached to a conductive RDL feature 222. Solder features 220 may, for example, be solder balls that have been attached according any known process (e.g., with a solder flux and controlled heat treatment that may partially reflow one or more of the flux and solder features 220. Alternatively, solder features 220 may be studs or bumps comprising a conductive material (e.g., solder paste). Returning to FIG. 1B with processing of an active side of the panelized package components now substantially complete, methods 102 may optionally continue at block 108 with electrical testing of the base package, if desired. If block 108 is performed, electrical testing may, for example, check overall functionality of the base package. Block 108 may also include tests to determine the yield and/or quality of any package structures external of the IC chips, for example validating the function of one or more through-mold (through-carrier) vias before proceeding to subsequent blocks of methods 102.

Figure 2C:
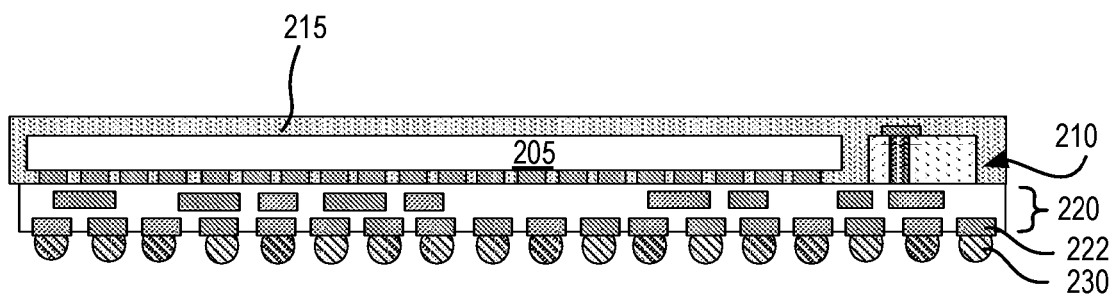

Methods 102 continue at block 112 where any lands of a via structure external to the IC chip are prepared for the subsequent attachment of another component. At block 112, any remaining package material on the non-active side of the via structure may be removed by any suitable technique as the removal method may depend on the manufacturing blocks previously performed. Alternatively, for embodiments where through-carrier vias are to be formed, those vias may be formed at block 112. For example, any via precursor structure that was embedded within the package material at operation 103 may be exposed and replaced with a conductive through-carrier via. In other embodiments, the carrier package material itself may be etched, ablated, or otherwise milled and filled at block 112 to form conductive through-mold or through-carrier vias adjacent to at least one edge of the IC chip. In the example illustrated in FIG. 2D, the package component from FIG. 2C is further processed to form an opening 260 through a thickness of package material 215 over via structure 210. Opening 260 exposes a land on conductive feature(s) 214. Opening 260 may have been patterned or be a result of a plasma clean if conductive feature(s) 214 had been exposed previously. Alternatively, a physical removal process (e.g., a grinding or lapping, etc.) may be employed to expose conductive feature(s) 214.

Returning to FIG. 1B, methods 102 continue at block 122 where adhesive features are formed above a second side of the package component. At least one adhesive feature may be formed above a single package component, for example over an inactive side of an IC chip, opposite the active side. Block 122 is advantageously performed while the package component and/or carrier material is still panelized, for example with the adhesive features applied to a backside of the panel. Each adhesive feature applied at block 122 may be subsequently employed for attaching another component. In panelized form, adhesive features may be formed a parallel according to a number of processes or techniques.

Figure 2D:
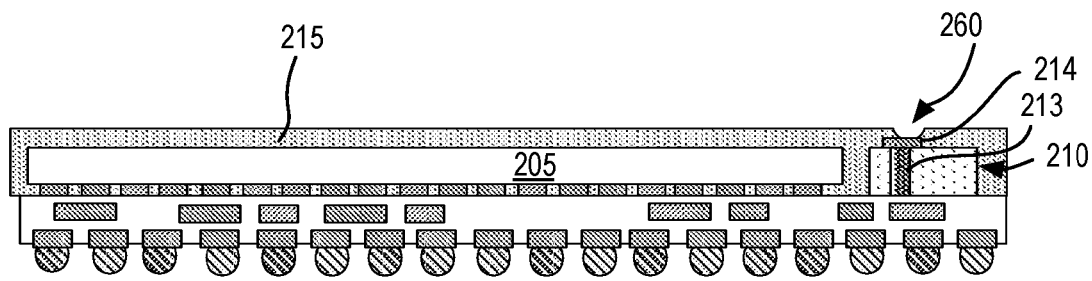
Figure 2E:
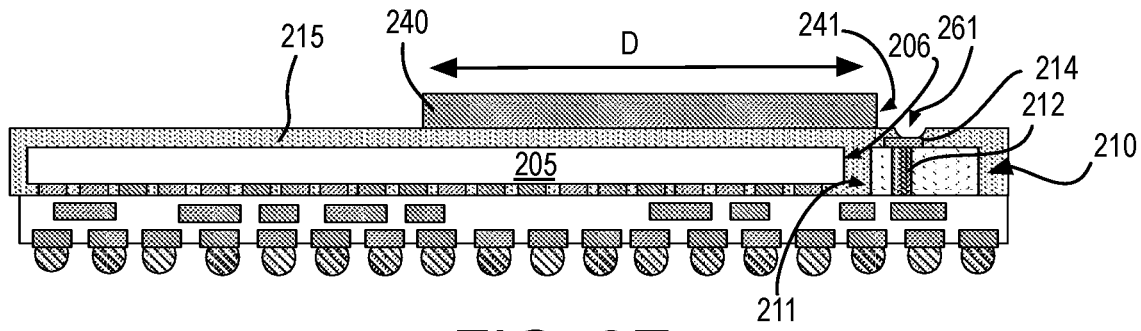

In the example further illustrated in FIG. 2E, an adhesive feature 240 has been applied to the package component that was illustrated in FIG. 2D. As shown in FIG. 2E, adhesive feature 240 has a lateral dimension D, which in this example is smaller than a lateral dimension of IC chip 205. As such, adhesive feature 240 is located over a portion of IC chip 205. In this example, a thickness of package material 215 is between adhesive feature 240 and IC chip 250. However, for some embodiments package material 215 may be substantially planar with the non-active side of IC chip 205. Adhesive feature 240 may extend beyond one or more edges of IC chip 205. In the illustrated example, adhesive feature sidewall 241 overlaps IC chip sidewall 206. Adhesive feature 240 may also overlap some portion of via structure 210. In the illustrated example adhesive feature sidewall 241 overlaps via structure edge 211. Adhesive feature 240 may be advantageously applied in a manner that avoids occluding via bar openings 261. Alternatively, the order of blocks 112 and 122 in methods 102 (FIG. 1B) may be swapped and openings 261 passed through a thickness of adhesive feature 240. Adhesive feature 240 may comprise any known package material(s). In some embodiments, adhesive feature 240 comprises an epoxy resin. For example, adhesive feature 240 may be any of the materials described above for package material 215. In some embodiments, adhesive feature 240 is a package material having a composition different than that of package material 215. For example, where both package material 215 and adhesive feature 240 comprise an epoxy resin, the two epoxy resins have different compositions. In a specific embodiment, package material 215 is a first of the materials described above for package material 215, and adhesive feature 240 comprises a second of the materials described above for package material 215. In some other embodiments where both package material 215 and adhesive feature 240 comprise an epoxy resin, there is no difference in composition of the two package materials, however package material 215 may be cured prior to application of adhesive feature 240 such that the material interface between package material 215 and adhesive feature 240 illustrated in FIG. 2E is indicative of the practice of methods 201 (FIG. 1B).

In some embodiments, adhesive feature 240 (FIG. 2E) is non-selectively applied and selectively patterned. In other embodiments, adhesive feature 240 is selectively applied. In some embodiments, adhesive feature 240 is applied in a wet or substantially uncured state, and subsequently partially cured. In other embodiments, adhesive feature 240 is applied in a semi-cured state, for example as a dry film (e.g., a pressure sensitive adhesive, die attach film, etc.). As one example, adhesive feature 240 may be applied by screen printing where any suitable pre manufactured screen or mesh is positioned over a workpiece (panel or wafer), aligned to reference markers, and adhesive is forced through openings in the mesh that are located over one or more of the underlying IC chip 205 and/or package material 215. A mask-based patterning process may also be employed to apply adhesive feature 240. For example, a light sensitive adhesive material may be dispensed or spun onto the workpiece, and the adhesive exposed to light energy to define boundaries of the adhesive feature over one or more of the underlying IC chip 205 and/or package material 215. One of the unexposed or exposed adhesive materials may then be removed with any suitable solvent. In other embodiments, adhesive feature 240 may be selectively dispensed, for example from a needle matrix in which each needle position is to administer a pre-determined dosage of adhesive material onto one or more of the underlying IC chip 205 and/or package material 215 to which the adhesive is to be applied. In another example, pre-formed adhesive pads having the desired dimensions of adhesive feature 240 may be placed onto one or more of the underlying IC chip 205 or package material 215. Placement of the pads of adhesive material may be by any suitable technique, such as, but not limited to, pick-and-place machinery.

Following the application of adhesive feature 240, the physical shape and/or composition of the feature may be defined and/or influenced, for example by exposing the wafer to a controlled heating or energy source (e.g., IR lamp, laser, etc.). Such processing may pre-harden adhesive feature 240, for example modifying an epoxy resin from a wet state to a semi-cured state. Through process optimization of the application and treatment stages, a subsequent use of underfill for the component that is to be affixed to adhesive feature 240 may be minimized or even avoided all together.

Returning to FIG. 1B, methods 101 continue at block 132 where one or more additional components are affixed to the adhesive feature that was formed at block 122. A component may be pushed into adhesive material on the underlying substrate using any process offering sufficient placement and pressure control. The controlled die attach process together with an engineered shape and/or quantity of adhesive material may provide a stable foundation underneath the applied component. The component(s) attached at block 132 may be any suitable for a PoP package assembly. In some examples, at block 132 an unpackaged IC chip is attached to the adhesive feature. In some other examples, at block 132 a packaged IC chip is attached to the adhesive feature. In some such examples, a packaged IC chip attached at block 132 includes one or more RDL layers within the package. In some further examples, a packaged IC chip attached at block 132 includes an encapsulant over one or more sides of the packaged IC chip (e.g., the IC chip has been overmolded). In some further examples, a packaged IC chip attached at block 132 includes external interconnect features that are to interface with the via structure that was prepared at block 112.

Figure 2F:
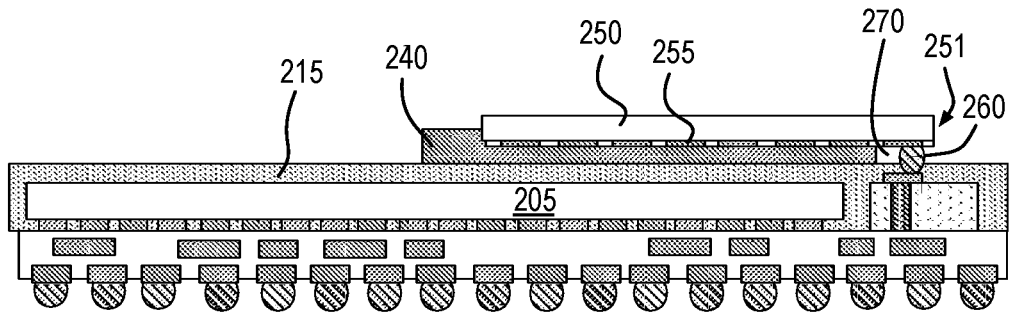

In the example further illustrated in FIG. 2F, an IC chip 250 has been affixed to adhesive feature 240. IC chip 250 may include any integrated circuitry. In some embodiments, IC chip 205 includes memory circuitry. In some such embodiments, the memory circuitry comprises a random access memory (RAM), and more specifically a dynamic RAM (DRAM), such as, but not limited to low power DRAM (e.g., LPDDR4, or any other suitable mobile DDR). In one exemplary embodiment, where IC chip 250 is a mobile DDR memory chip, IC chip 205 includes a BBP with the PoP then providing package-level interconnect between the chips and being well suited for a mobile phone, or other wireless/mobile device. As further shown in FIG. 2F, a plurality of interconnects 260 each extend through the openings 261. Interconnects 260 may be any suitable interconnect, such as, but not limited to, a solder feature (e.g., bump, mini ball, pillar or post connection). Interconnects 260 may be further coupled to IC chip 250 through one or more redistribution layer 255. RDL(s) 255 may for example, concentrate I/O ports proximal to one or more edges of an active side of IC chip 250. In the embodiment shown in FIG. 2F, interconnects 260 comprise a row or column of solder features proximal to chip edge 251. In this example, interconnects 260 are limited to a portion of a footprint of IC chip 250 that overhangs beyond adhesive feature sidewall 241 such interconnects 260 are separated from adhesive feature sidewall 241 by region 270.

Returning to FIG. 1B, methods 102 may optionally continue at block 134 where the interconnects of the component affixed to the adhesive material are underfilled, and/or methods 102 may continue at block 136 where one or more additional package materials are applied over the component that was affixed at block 132. As noted above, underfilling block 134 may be avoided in some embodiments, for example where the adhesive material applied at block 122 offers sufficient protection from corrosion and/or other interconnect failure modes. If underfilling block 134 is performed in methods 102, the underfill material may at least partially fill region 270. Any suitable underfill material may be applied at block 134, such as, but not limited to any epoxy resin known to be suitable for such an underfilling application. In some embodiments region 270 is at least partially filled with an underfill material that has a different composition than the package material employed as adhesive feature 240. In other embodiments, region 270 is at least partially filled with an underfill material that has the same composition than the package material employed as adhesive feature 240. For such embodiments however, a material interface between the underfill material and the adhesive feature sidewall 241 may nevertheless be indicative of the practice of methods 201.

Figure 2G:
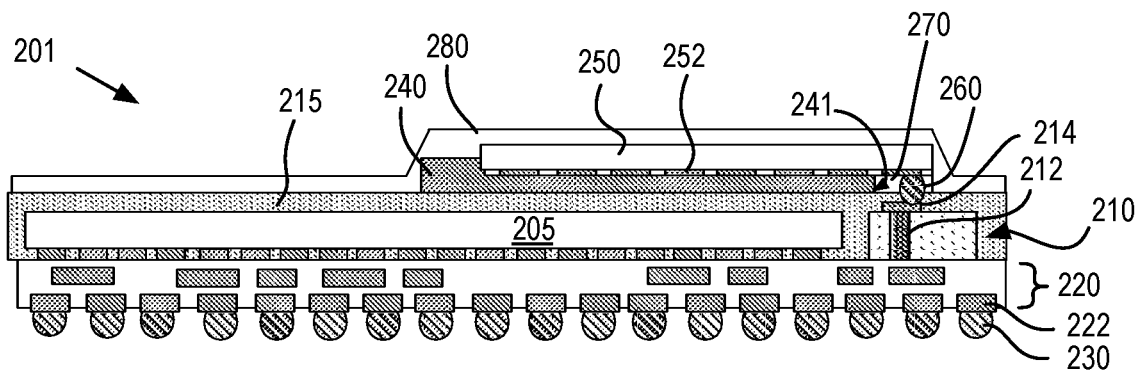

FIG. 2G further illustrates embodiments where an optional top package material 280 has been applied over IC chip 250. Package material 280 may, for example, have been applied at block 136 in FIG. 1B. Alternatively, the component attached at block 132 may have included a top cap as part of a prefabricated package. In the example shown in FIG. 2G, package material 280 extends over an entirety of a non-active side of IC chip 250, and also over an entirety of package material 215, which is indicative of a blanket deposition process. A spin coat process, molding process, or a spray coating process may have deposited package material 280, for example. Package material 280 may have any composition known to be suitable for further protecting a packaged IC from its target use environment. In some embodiments, for example, package material 280 is an epoxy resin. In some such embodiments where adhesive feature 240 also comprises an epoxy resin, package material 280 has a different composition than adhesive feature 240. In some further embodiments where package material 215 also comprises an epoxy resin, package material 280 has a different composition than at least one of adhesive feature 240 and package material 215. In some such embodiments, package material 280 has a different composition than both adhesive feature 240 and package material 215. In some other embodiments where adhesive feature 240 also comprises an epoxy resin, package material 280 has the same composition as at least one of adhesive feature 240 and package material 215. In some such embodiments, package material 280 has the same composition as both adhesive feature 240 and package material 215. A mechanical material interface between package material 280 and the adhesive feature sidewall 241, and/or between package material 280 and package material 215 may nevertheless be indicative of the practice of block 136 in methods 201.

Returning to FIG. 1B, methods 102 continue at block 152 where a reflow process is performed to reflow at least the interconnects between the second component and lands of the via structure. The reflow may make permanent electrical contact between the top component and the via structure and/or through-mold vias. Any reflow process known to be suitable for the chosen interconnects may be performed at block 152. During the reflow process, the elevated temperature may further cure one or more of the package materials that have been applied during methods 102. For example, the adhesive features formed at block 122 may be cured into a final package material. Likewise, any final package material(s) applied at block 136 may also be cured into a final state. Methods 102 are then completed at block 162, for example with marking and singulation of the PoPs.

Figure 3A:
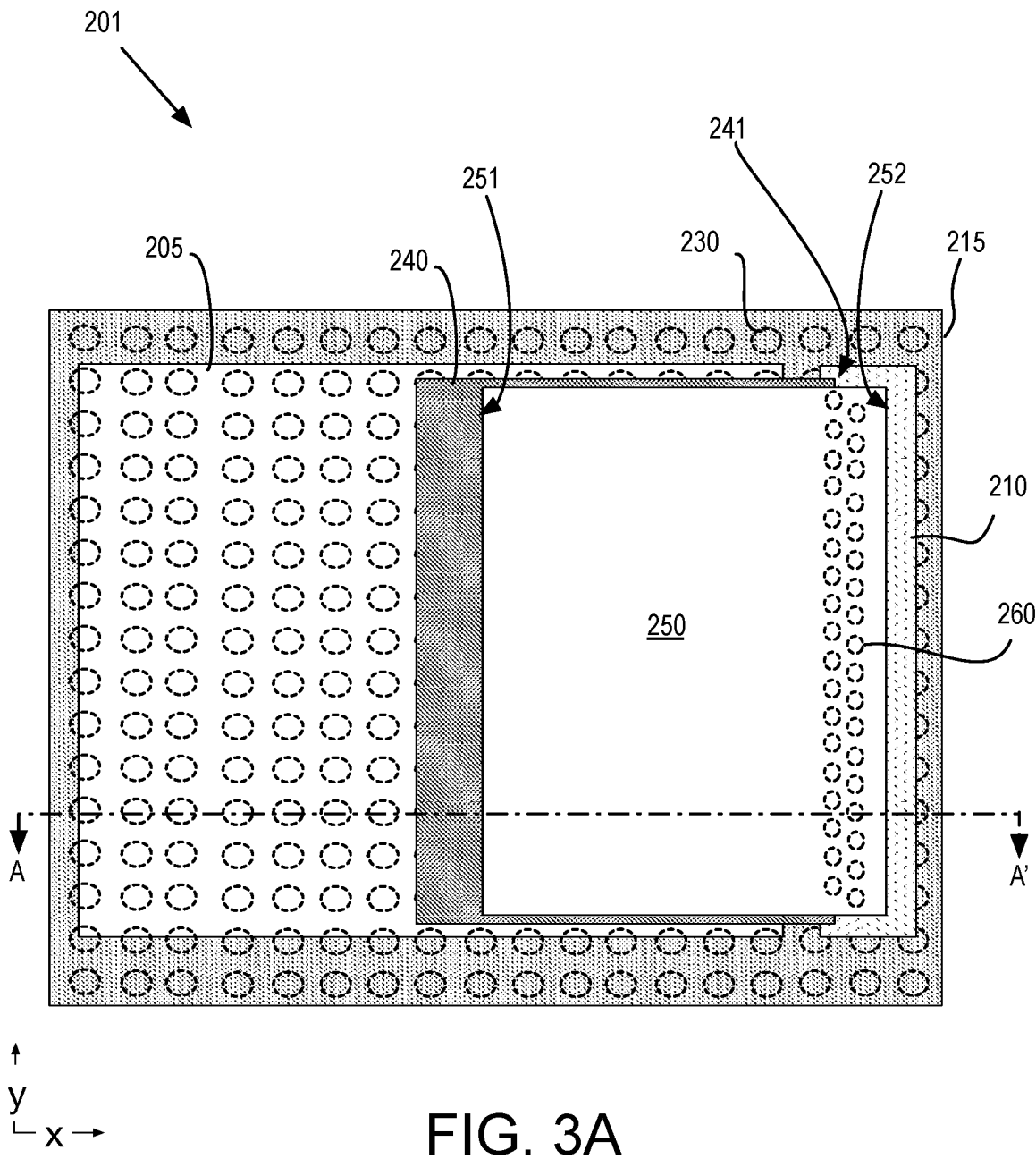
FIG. 3A illustrates a top-down plan view of a fan out PoP with adhesive die attach, in accordance with some embodiments.
Figure 3B:
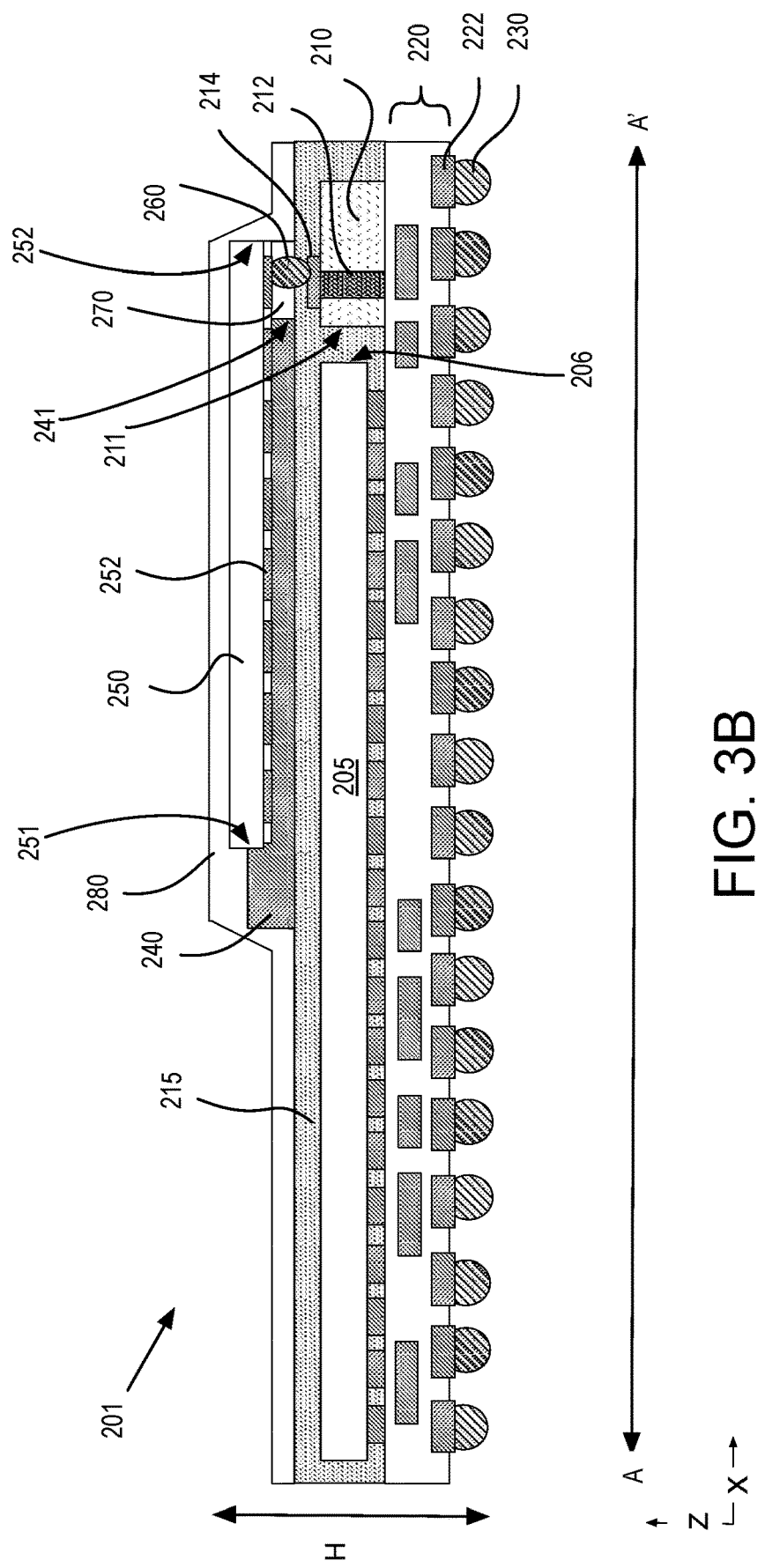
FIG. 3B illustrates a cross-sectional view of a fan out PoP with adhesive die attach, in accordance with some embodiments.

With microelectronic device assembly methods for PoPs with adhesive die attach described above, structural features of an exemplary microelectronic device package assembly are further described below in the context of FIG. 3A and FIG. 3B to emphasize physical attributes indicative of the assembly methods. FIG. 3A illustrates a top-down plan view of a fan out PoP 201 that includes adhesive die attach, in accordance with some embodiments. FIG. 3B illustrates a cross-sectional view of the fan out PoP 201 along the A-A' line shown in FIG. 3A, in accordance with some further embodiments. The fan out PoP 201 may be fabricated according to methods 101, and more specifically according to methods 102, for example.

Referring first to FIG. 3A, PoP 201 occupies a footprint within an x-y plane. Within that footprint, package material 215 occupies a fan out region beyond sidewalls of IC chip 205, which includes at least one integrated circuit. As shown in dotted line, interconnects 230 are arrayed within a footprint of IC chip 205. One or more rows or columns of interconnects 230 are within an area of the fan out region. Within the footprint of package material 215, via structure 210 is adjacent to one edge of IC chip 205. Adhesive feature 240 is positioned over a portion of IC chip 205 and further occupies an area that extends beyond an edge sidewall of IC chip 205 proximal to via structure 210. Another component including at least IC chip 250 is positioned over adhesive material 240. IC chip sidewall 252 overlaps adhesive feature sidewall 241 proximal to via structure 210 with one or more rows or columns of a plurality of interconnects 260 (e.g., solder features) aligned with one or more IC chip sidewall 252. Interconnects 260 may be confined to within the area of overlap or overhang between IC chip 250 and via structure 210, for example. IC chip 250 is electrically coupled to via structure 210 at least through interconnects 260. In the illustrated example, interconnects 260 are located beyond adhesive material sidewall 241 and therefore adhesive material is absent from between interconnects 260. Although two staggered columns (rows) of interconnects 260 are shown in FIG. 3A, embodiments may also have only one column or many more than two columns or interconnects. An opposite adhesive material edge extends beyond an IC chip sidewall 251 that is opposite chip sidewall 252 (and opposite via structure 210). Interconnects 260 may be further present along at least some portion of another edge (e.g., orthogonal to chip sidewall 252), for example where IC chip 250 has a larger area extending beyond adhesive sidewall 241, and via structure 210 has a greater width (e.g., in the x-dimension).

As shown in the cross-sectional view of FIG. 3B, PoP 201, package material 215 is between IC chip sidewall 206 and via structure sidewall 211. RDL 220 is electrically coupled to a first side of IC chip 205. RDL 220 is also electrically coupled to a first side of via structure 210. IC chip 250, which includes at least one integrated circuit, is over a second side of IC chip 205, opposite RDL 220. Circuitry of IC chip 250 is electrically coupled to a second side of via structure 210. Adhesive feature 240 comprising another package material is located between at least a portion of IC chip 205 and at least a portion of IC chip 250. As further shown in FIG. 3B, package material 215 is between adhesive feature 240 and the second, non-active side of IC chip 205. With adhesive feature sidewall 241 overlapping via structure sidewall 211, a portion of adhesive feature 240 is between via structure 210 and a IC chip 250. Package material 215 is also between adhesive feature 241 and a second side of via structure 210. In the illustrated example, adhesive material 240 is absent from between interconnects 260. Region 270 may therefore be a void, or an underfilled package material may surround interconnects 260. Such an underfilled package material is between IC chip 250 and package material 215 with a sidewall of the underfilled package material then adjacent to a adhesive material sidewall 241.

As noted above, one or more of package material 215, adhesive feature 240 and package material 280 may comprise an epoxy. Once the adhesive properties of adhesive feature 240 have been leveraged, the composition of adhesive feature 240 may remain distinguishable from the composition of package material 215, or the composition of adhesive feature 240 (e.g., following a cure process) may be substantially the same as package material 215. Likewise, following cure of adhesive feature 240, the composition of adhesive feature 240 may remain distinguishable from the composition of package material 280, or the composition of adhesive feature 240 may be substantially the same as package material 280. Nevertheless, physical material interfaces may remain as indicative of the methods performed to assembly PoP 201.

Figure 3C:
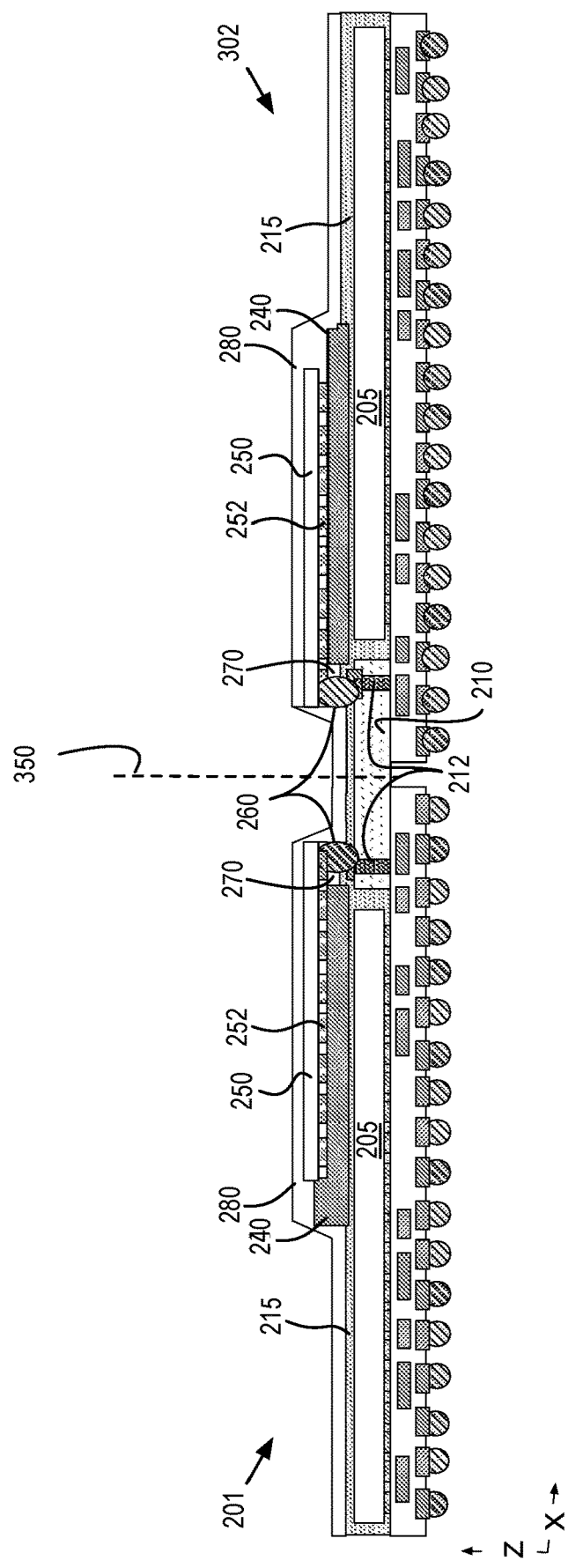
FIG. 3C illustrates a cross-sectional view of two adjoined fan out PoPs with adhesive die attach, in accordance with some embodiments.

FIG. 3C illustrates a cross-sectional view of two adjoined fan out PoPs 201 and 302 with adhesive die attach, in accordance with some embodiments. In this example, a single via structure 210 is shared between two adjacent PoPs 201, 302. Via structure 210 may be bifurcated (e.g., along dashed line 350) during a package singulation process. For such embodiments, an edge (e.g., along dashed line 350) of a portion of via structure 210 that is retained within each of PoP 201 and 302 will be not be embedded within package material 215. Hence, a mold epoxy may be between IC chip 205 and via structure 210, but absent from a side of via structure 210 opposite IC chip 205.

Figure 4:
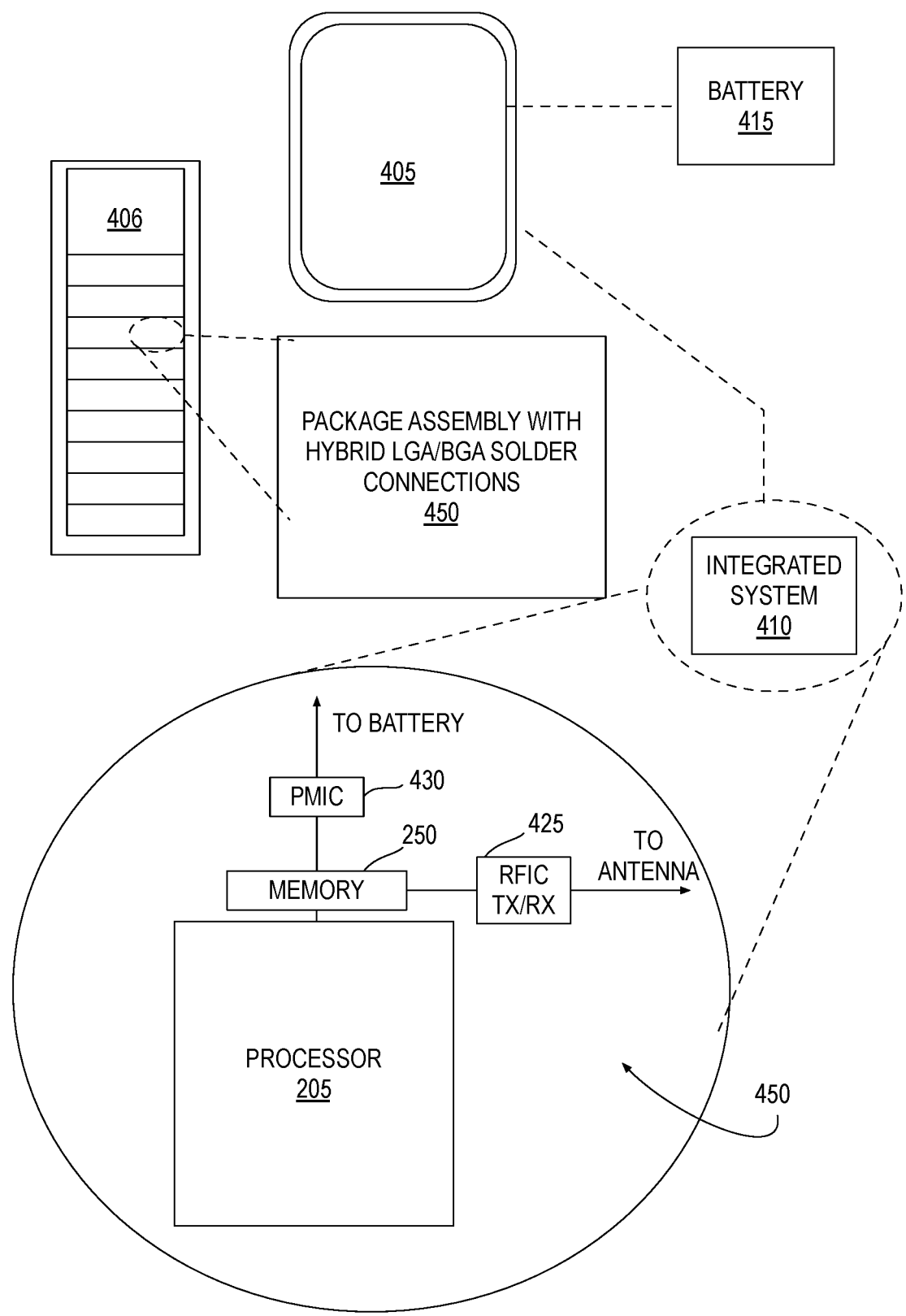
FIG. 4 illustrates a mobile computing platform and a data server machine employing a fan out PoP with adhesive die attach, in accordance with embodiments.

FIG. 4 illustrates a mobile computing platform and a data server machine employing a PoP package assembly including adhesive attach, for example as described elsewhere herein. The server machine 406 may be any commercial server, for example including any number of high-performance computing platforms disposed within a rack and networked together for electronic data processing, which in the exemplary embodiment includes a packaged monolithic SoC. The mobile computing platform 405 may be any portable device configured for each of electronic data display, electronic data processing, wireless electronic data transmission, or the like. For example, the mobile computing platform 405 may be any of a tablet, a smart phone, laptop computer, etc., and may include a display screen (e.g., a capacitive, inductive, resistive, or optical touchscreen), a chip-level or package-level integrated system 410, and a battery 415.

As a system component within the server machine 406, package assembly 450 may include a memory block (e.g., RAM) and a processor block (e.g., a microprocessor, a multi-core microprocessor, baseband processor, or the like) interconnected through RDL fan out and one or more via structures. As a packaged integrated system 410, package assembly 450 includes a PoP assembly with adhesive attach, for example as described elsewhere herein. Assembly 450 includes one or more of a power management integrated circuit (PMIC) 430, RF (wireless) integrated circuit (RFIC) 425 including a wideband RF (wireless) transmitter and/or receiver (TX/RX), and memory 435 are interconnected within a PoP assembly, which may be further interconnect onto a board within either server 406 or mobile device 405.

Functionally, PMIC 430 may perform battery power regulation, DC-to-DC conversion, etc., and so has an input coupled to battery 415 and with an output providing a current supply to other functional modules. As further illustrated, in the exemplary embodiment, RFIC 425 has an output coupled to an antenna (not shown) to implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond.

Figure 5:
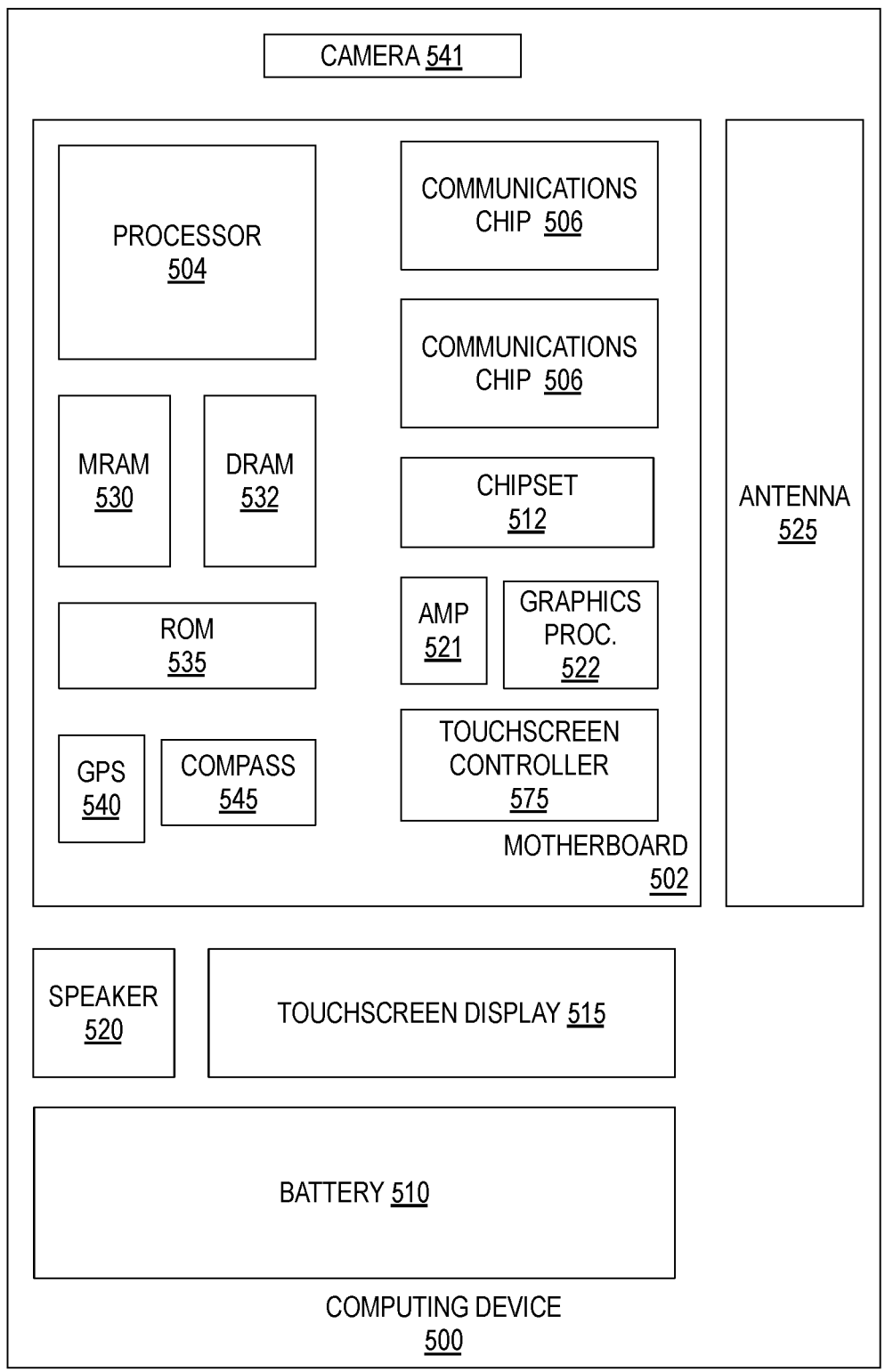
FIG. 5 is a functional block diagram of an electronic computing device, in accordance with some embodiments.

FIG. 5 is a functional block diagram of an electronic computing device, in accordance with some embodiments. Computing device 500 may be found inside platform 405 or server machine 406, for example. Device 500 further includes a motherboard 502 hosting a number of components, such as, but not limited to, a processor 504 (e.g., an applications processor), which may be in a package coupled to motherboard 502 by a PoP assembly with adhesive die attach, for example as described elsewhere herein. Processor 504 may be physically and/or electrically coupled to motherboard 502. In some examples, processor 504 includes an integrated circuit die packaged within the processor 504 and connections between the IC die and the processor 504 are within a PoP assembly with adhesive attach, for example as described elsewhere herein. In general, the term "processor" or "microprocessor" may refer to any device or portion of a device that processes electronic data from registers and/or memory to transform that electronic data into other electronic data that may be further stored in registers and/or memory.

In various examples, one or more communication chips 506 may also be physically and/or electrically coupled to processor 504 within a PoP assembly. Depending on its applications, computing device 500 may include other components that may or may not be physically and electrically coupled to motherboard 502. These other components include, but are not limited to, volatile memory (e.g., DRAM), non-volatile memory (e.g., ROM), flash memory, a graphics processor, a digital signal processor, a crypto processor, a chipset, an antenna, touchscreen display, touchscreen controller, battery, audio codec, video codec, power amplifier, global positioning system (GPS) device, compass, accelerometer, gyroscope, speaker, camera, and mass storage device (such as hard disk drive, solid-state drive (SSD), compact disk (CD), digital versatile disk (DVD), and so forth), or the like. Any of these other components may also be coupled to motherboard 502, for example by BGA solder connections present on a PoP assembly, for example as described elsewhere herein.

Communication chips 506 may enable wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 506 may implement any of a number of wireless standards or protocols, including but not limited to those described elsewhere herein. As discussed, computing device 500 may include a plurality of communication chips 506. For example, a first communication chip may be dedicated to shorter-range wireless communications, such as Wi-Fi and Bluetooth, and a second communication chip may be dedicated to longer-range wireless communications such as GPS, EDGE, GPRS, CDMA, WiMAX, LTE, Ev-DO, and others.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

It will be recognized that principles of the disclosure are not limited to the embodiments so described, but can be practiced with modification and alteration without departing from the scope of the appended claims. The above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A microelectronic device package assembly, comprising:
    a first chip comprising a first integrated circuit (IC);
    a via structure adjacent to the first chip;
    a first package material between a sidewall of the first chip and a sidewall of the via structure;
    one or more redistribution layers electrically coupled to a first side of the first chip and to a first side of the via structure;
    a second chip comprising a second IC, wherein the second chip is over a second side of the first chip, opposite the first side, and wherein the second chip is electrically coupled to a second side of the via structure through a plurality of interconnects comprising solder features; and
    a second package material between at least a portion of the first chip and at least a portion of the second chip, wherein the second package material is in contact with the second chip and absent from between the solder features.

2. The device package assembly of claim 1, wherein the first package material is between the second package material and the second side of the first chip.

3. The device package assembly of claim 2, wherein:
    the second package material is between at least a portion of the via structure and at least a portion of the second chip; and
    the first package material is between the second package material and the second side of the via structure.

4. The device package assembly of claim 1, further comprising a third package material between the solder features.

5. The device package assembly of claim 4, wherein the third package material is between the second chip and the first package material, and wherein a sidewall of the third package material is adjacent to a sidewall of the second package material.

6. The device package assembly of claim 1, wherein:
    the interconnects are aligned in a row adjacent to a first edge of the second chip;
    a first portion of a footprint of the second chip occupied by the row of interconnects overhangs beyond an edge of the second package material; and
    a second portion of the footprint of the second chip not occupied by the row of interconnects is in contact with the second package material.

7. The device package assembly of claim 1, wherein the second package material extends beyond at least a second edge of the second chip, opposite the first edge of the second chip.

8. The device package assembly of claim 1, wherein:
    the first package material comprises a first epoxy;
    the second package material comprises a second epoxy; and wherein
    the assembly further comprises a third epoxy over the second chip.

9. A packaged microelectronic device, comprising:
    a microprocessor chip, wherein a first side of the microprocessor chip is electrically coupled to one or more redistribution layers of a package;
    a via structure adjacent to the microprocessor chip, wherein a first side of the via structure is electrically coupled to the one or more redistribution layers;
    a first package material between a sidewall of the microprocessor chip and a sidewall of the via structure;
    a memory chip over a second side of the microprocessor chip, over a second side of the via structure, and electrically coupled to the second side of the via structure through a plurality of interconnects comprising solder features; and
    a second package material between the microprocessor chip and the memory chip, wherein the second package material is in contact with the second chip, and an edge of the second package material proximal to the interconnects is laterally spaced apart from a sidewall of at least one of the solder features.

10. The microelectronic device of claim 9, wherein the microprocessor comprises a baseband radio processor, and wherein the memory chip comprises a DRAM.

11. The microelectronic device of claim 9, wherein:
the first package material is over the second side of the processor chip and the memory chip;
the second package material is over the first package material; and
the plurality of interconnects extend through a thickness of the first package material that is over the second side of the memory chip.

12. The microelectronic device of claim 11, further comprising a third package material between the interconnects and between the edge of the second package material and the sidewall of at least one of the interconnects.

13. A method of fabricating a microelectronic package assembly, the method comprising:
receiving a workpiece, the workpiece comprising a first chip and a via structure embedded within a first package material, wherein a first side of the first chip and a first side of the via structure are electrically coupled to one or more redistribution layers of a package;
applying a second package material above a second side of at least a portion of the first chip;
adhering a second chip to the assembly through contact with the second package material;
electrically coupling the second chip to a second side of the via structure by reflowing-a plurality of interconnects comprising solder features; and
underfilling a third package material between the plurality of solder interconnects electrically coupled to the second chip.

14. The method of claim 13, wherein applying the second package material comprises at least one of screen printing an adhesive material, patterning a layer of an adhesive material, needle dispensing an adhesive material, or pick-and-placing a pre-fabricated pad of an adhesive material.

15. The method of claim 13, further comprising assembling the workpiece prior to applying the second package material, the assembling comprising:
molding the first chip and the via structure within the first package material;
forming the one or more redistribution layers coupled to the first side of the first chip and to the first side of the via structure; and
forming a plurality of second interconnects on a first side of the first package material and coupled to the one or more redistribution layers.

16. The method of claim 13, further comprising forming a through-mold via through a thickness of the first package material that is over the second side of the via structure.

17. The method of claim 13, further comprising pre-curing the second package material prior to attaching the second chip.

18. The method of claim 13, further comprising:
coating, molding, or spraying a final package material over the second chip.

19. The method of claim 13, further comprising forming the via structure.

20. The method of claim 19, wherein forming the via structure comprises attaching a prefabricated via structure or forming a through mold via within the first package material.

* * * * *